United States Patent
Pels et al.

(10) Patent No.: US 10,214,835 B2
(45) Date of Patent: Feb. 26, 2019

(54) POST-SYNTHESIS PROCESSING OF DIAMOND AND RELATED SUPER-HARD MATERIALS

(71) Applicant: ELEMENT SIX TECHNOLOGIES LIMITED, Didcot, Oxfordshire (GB)

(72) Inventors: Gerrit Jan Pels, Cuijk (NL); Hendrikus Gerardus Maria De Wit, Cuijk (NL); Mark Robin McClymont, Ascot (GB)

(73) Assignee: Element Six Technologies Limited, Didcot, Oxfordshire (GB)

( * ) Notice: Subject to any disclaimer, the term of this patent is extended or adjusted under 35 U.S.C. 154(b) by 0 days.

(21) Appl. No.: 14/892,733

(22) PCT Filed: Jun. 4, 2014

(86) PCT No.: PCT/EP2014/061570
§ 371 (c)(1),
(2) Date: Nov. 20, 2015

(87) PCT Pub. No.: WO2014/195354
PCT Pub. Date: Dec. 11, 2014

(65) Prior Publication Data
US 2016/0115624 A1  Apr. 28, 2016

(30) Foreign Application Priority Data

Jun. 7, 2013  (GB) .................................. 1310212.4

(51) Int. Cl.
*C30B 25/16* (2006.01)
*C30B 29/04* (2006.01)
(Continued)

(52) U.S. Cl.
CPC .............. *C30B 25/16* (2013.01); *B24B 49/10* (2013.01); *B26D 5/007* (2013.01); *C30B 29/04* (2013.01);
(Continued)

(58) Field of Classification Search
CPC ......... C30B 25/00; C30B 25/02; C30B 25/16; C30B 25/18; C30B 25/186; C30B 33/00;
(Continued)

(56) References Cited

U.S. PATENT DOCUMENTS 5,458,827 A   10/1995  Holly
7,183,548 B1   2/2007  Kley
(Continued)

FOREIGN PATENT DOCUMENTS

CN   101524819 A   9/2009
EP     1832672 A1   9/2007
(Continued)

OTHER PUBLICATIONS

H. Buchkremer-Hermanns, et al. publication entitled "ECR plasma polishing of CVD diamond films," Diamond and Related Materials, vol. 5, pp. 845-849 (1996).*
(Continued)

*Primary Examiner* — Kenneth A Bratland, Jr.
(74) *Attorney, Agent, or Firm* — Dean W. Russell; Clark F. Weight; Kilpatrick Townsend & Stockton LLP

(57) ABSTRACT

A method of processing a super-hard material having a Vickers hardness of no less than 2000 kg/mm2, the method comprising: (a) forming a surface of the super-hard material to have a first surface profile within a first root mean square deviation being no more than 5 μm; (b) analyzing said surface of the super-hard material to detect a plurality of protruding regions on said surface; and (c) selectively processing over only the protruding regions on the surface of
(Continued)

the super-hard material to form a second surface profile within a second root mean square deviation from the smooth target surface profile, said second root mean square deviation being no more than 100 nm.

14 Claims, 6 Drawing Sheets

(51) Int. Cl.
*C30B 33/00* (2006.01)
*C30B 33/04* (2006.01)
*C30B 33/08* (2006.01)
*B24B 49/10* (2006.01)
*B26D 5/00* (2006.01)

(52) U.S. Cl.
CPC .............. *C30B 33/00* (2013.01); *C30B 33/04* (2013.01); *C30B 33/08* (2013.01)

(58) Field of Classification Search
CPC ......... C30B 33/04; C30B 33/08; C30B 33/12; C30B 29/00; C30B 29/02; C30B 29/04; B24B 49/10; B26D 5/007
USPC ..................... 117/84–86, 106, 108, 902, 913
See application file for complete search history.

(56) References Cited

U.S. PATENT DOCUMENTS

| | | | | |
|---|---|---|---|---|
| 2004/0177803 | A1* | 9/2004 | Scarsbrook ............. | C30B 25/02 117/68 |
| 2006/0102854 | A1* | 5/2006 | Neogi ...................... | B24B 9/16 250/492.1 |
| 2008/0030876 | A1* | 2/2008 | Kataoka ................. | B23K 26/03 359/719 |

FOREIGN PATENT DOCUMENTS

| | | |
|---|---|---|
| GB | 2433737 A | 7/2007 |
| JP | 3555114 B2 | 8/2004 |
| WO | 2005032757 A1 | 4/2005 |
| WO | 2006047611 A2 | 5/2006 |
| WO | 2008090511 A1 | 7/2008 |

OTHER PUBLICATIONS

H. Buchkremer-Hermanns, et al. publication entitled "ECR plasma polishing of CVD diamond films," Diamond and Related Materials, vol. 5, pp. 845-849 (1996). (Year: 1996).*

Turri, Giorgio, et al, Optical absorption, depolarization, and scatter of epitaxial signle-crystal chemical-vapor-deposited diamond at 1.064 [um], Optical Engineering, Jun. 2007, pp. 064002-1-064002-10, vol. 46, No. 6, SPIE, Bellingham, WA.

Dodson, J.M., et al, Single crystal and polycrystalline CVD diamond for demanding optical applications, Window and Dome Technologies and Materials XII, Proceedings of SPIE, 2011, vol. 8016, SPIE, Bellingham, WA.

Sasano, Tomohiko, et al, Reflectivities of chemical vapor deposition-diamond mirrors in the vacuum ultraviolet region, Review of Scientific Instruments, Feb. 1995, pp. 2211-2213, vol. 66, No. 2, American Institute of Physics, Melville, NY.

Windischmann, Henry, et al, Free-standing diamond membranes: optical, morphological and mechanical properties, Diamond and Related Materials, 1992, pp. 656-664, vol. 1, No. 5-6, Elsevier Science Publishers, Amsterdam, NL.

Sussmann, R. S., et al, Properties of bulk polycrystalline CVD diamond, Diamond and Related Materials, 1994, pp. 303-312, vol. 3, No. 4-6, Elsevier Science Publishers, Amsterdam, NL.

Bogdan, G., et al, Freestanding (100) homoepitaxial CVD diamond, Diamond and Related Materials, 2006, pp. 508-512, vol. 15, No. 4-8, Elsevier Science Publisher, Amsterdam, NL.

Buchkremer-Hermanns, H., et al, ECR plasma polishing of CVD diamond films, Diamond and Related Materials, 1996, pp. 845-849, vol. 5, No. 6-8, Elsevier Science Publisher, Amsterdam, NL.

Kiyohara, Shuji, et al, Reactive ion beam machining of diamond using an ECR-type oxygen source, Nanotechnology, 1996, pp. 270-274, vol. 7, IOP Publishing Ltd., Bristol, UK.

Tsuchiya, K., et al, Improvement of surface roughness by oxygen ion beam machining, Nanotechnology, 1995, pp. 158-161, vol. 6, IOP Publishing Ltd., Bristol, UK.

Whetten, Timothy, J., et al, Etching of diamond with argon and oxygen ion beams, Journal of Vacuum Science & Technology A: Vacuum, Surfaces, and Films, Apr.-Jun. 1984, pp. 477-480, vol. 2, No. 2, American Vacuum Society, Cary, NC.

United Kingdom Patent Application No. GB1310212.4, Combined Search and Examination Report dated Dec. 6, 2013.

United Kingdom Patent Application No. GB1409891.7, Combined Search and Examination Report dated Feb. 27, 2015.

International Patent Application No. PCT/EP2014/061570, International Search Report and Written Opinion dated Aug. 21, 2014.

* cited by examiner

POST-SYNTHESIS PROCESSING OF DIAMOND AND RELATED SUPER-HARD MATERIALS

CROSS REFERENCE TO RELATED APPLICATIONS

This application is the U.S. national phase of International Application No. PCT/EP2014/061570 filed on Jun. 4, 2014, and published in English on Dec. 11, 2014 as International Publication No. WO 2014/195354 A1, which application claims priority to Great Britain Patent Application No. 1310212.4 filed on Jun. 7, 2013, the contents of which are incorporated herein by reference.

FIELD OF THE INVENTION

The present invention relates to post-synthesis processing of diamond and related super-hard materials.

BACKGROUND OF INVENTION

In the context of the present invention super-hard materials are defined as those materials having a Vickers hardness of no less than 2000 kg/mm$^2$. These materials include a range of diamond materials, cubic boron nitride materials (cBN), sapphire, and composites comprising the aforementioned materials. For example, diamond materials include chemical vapour deposited (CVD) single crystal and polycrystalline synthetic diamond materials of a variety of grades, high pressure high temperature (HPHT) synthetic diamond materials of a variety of grades, natural diamond material, and diamond composite materials such as polycrystalline diamond which includes a metal binder phase (PCD) or silicon cemented diamond (ScD) which includes a silicon/silicon carbide binder phase.

In relation to the above, it should be noted that while super-hard materials are exceedingly hard, they are generally very brittle and have low toughness. As such, these materials are notoriously difficult to process into a product after the raw material is synthesized. Any processing method must be sufficiently aggressive to overcome the extreme hardness of the super-hard material while at the same time must not impart a large degree of stress or thermal shock to the material which would cause macroscopic fracturing of the material due to its brittle nature and low toughness. Furthermore, for certain applications it is important that surface and sub-surface damage at a microscopic scale, such as microcracking, is minimized to avoid deterioration of functional properties which may result from such surface and sub-surface damage including, for example, optical scattering, increased optical absorption, decreased wear resistance, and increased internal stress resulting in a decrease in coherence time for quantum spin defects near the processed surface.

There is narrow operating window for achieving successful processing of super-hard materials and many available processing methods fall outside this operating window. For example, most processing methods are not sufficiently aggressive to process super-hard materials to any significant extent in reasonable time-frames. Conversely, more aggressive processing techniques tend to impart too much stress and/or thermal shock to the super-hard material thus causing cracking and material damage or failure.

Certain processing methods have operational parameters which can be altered so as to move from a regime in which no significant processing of a super-hard material is achieved into a regime in which processing is achieved but with associated cracking and damage or failure of the super-hard material. In this case, there may or may not be a transitional window of parameter space in which processing can be achieved without cracking and damage or failure of the super-hard material. The ability to operate within a suitable window of parameter space in which processing can be achieved without cracking and damage or failure of the super-hard material will depend on the processing technique, the size of any transitional operating window for such a technique, and the level of operation parameter control which is possible to maintain processing within the window of parameter space in which processing can be achieved without cracking and damage or failure of the super-hard material.

In light of the above, it will be appreciated that post-synthesis processing of super-hard materials is not a simple process and, although a significant body of research has been aimed at addressing this problem, current processing methods are still relatively time consuming and expensive, with processing costs accounting for a significant proportion of the production costs of super-hard material products.

Post synthesis processing may comprise one or more of the following basic processes:
  surface processing to remove material from the surface of the as-grown super-hard material in order to increase surface flatness, decrease surface roughness, remove surface defects, and/or attain a target thickness for the super-hard material;
  surface processing to achieve a fine surface finish where minimal material is removed from the super-hard product, i.e. polishing; and
  cutting of the super-hard material into target shapes and sizes for particular product application.

In principle there are two basic forms of mechanical surface processing: (i) a two-body process in which abrasive particles are embedded/fixed in one body which is moved against a second body to process the second body; and (ii) a three-body process in which one body is moved relative to a second body to be processed and free abrasive particles, constituting a third body, are disposed between the first and second bodies in order to achieving surface processing of the second body.

The latter three-body approach to surface processing is known as lapping and it is this approach which is conventionally used to remove macroscopic quantities of surface material from super-hard materials. Three-body lapping, as opposed to a two-body surface processing technique, is preferred for removing macroscopic quantities of surface material from super-hard materials as it has been found that lapping is more efficient at removing surface material from a super-hard material without imparting a large degree of stress or thermal shock to the material which would cause macroscopic fracturing of the material due to its brittle nature and low toughness. In contrast, when it is desired to achieve a fine surface finish without removing macroscopic quantities of material then a two-body processing technique may be utilized. As such, conventionally lapping is used to remove material from the surface of an as-grown super-hard material in order to increase surface flatness, decrease surface roughness, remove surface defects, and/or attain a target thickness for the super-hard material. Subsequently, if a fine surface finish is required, the super-hard material is polished and this may be performed using a two-body surface processing technique in which abrasive material is fixed in a polishing wheel such as via resin bonding. Polishing may also be achieved using an iron or steel wheel which is diamond impregnated and this is known as scaife polishing. Although scaife polishing generally utilizes free diamond abrasive particles these are of a small size relative to pores within the iron or steel wheel and are thus embedded/fixed into the wheel thus effecting a two-body processing as opposed to a true three body lapping process.

In addition to the aforementioned mechanical lapping and polishing techniques a number of other techniques have been proposed for processing super-hard materials including:

chemical techniques include etching techniques such as plasma etching using suitable gas chemistries including, for example, one or more of hydrogen, oxygen, argon (or other inert gases), and chlorine (or other halides)—an example of an etching technique for achieving low surface roughness diamond surface finishes is described in WO2008/090511;

chemo-mechanical processing (CMP) techniques which combine mechanical and chemical processing mechanisms utilizing CMP slurries including abrasive grit particles and chemical components which react with the surface of the super-hard material being processed to change the chemical composition of the surface making it easier to remove—such processes having being utilized for other materials and are now currently under development for super-hard materials such as those comprising diamond;

laser beam cutting/ablating—laser cutting is the industry standard for cutting of synthetic diamond products;

high energy particle beam cutting/ablating—electron beam cutting has been proposed for cutting diamond products in the past and has recently been adapted to cut super-hard materials at significantly faster rates when compared with laser cutting;

electric discharge machining (EDM)—this technique is useful for cutting electrically conductive super-hard materials such as boron doped diamond materials; and focussed ion beam (FIB) surface processing—this technique is known in the art for processing super-hard materials such as diamond as discussed in more detail below.

Bayn et al. have described the use of FIB processing for fabricating nanophotonic structures in single crystal diamond for quantum applications. They report that a FIB processed diamond surface can be treated with a hydrogen plasma followed by acid treatment and that this improves optical and luminescence properties of the FIB processed diamond surfaces. In contrast to the previous studies of plasma treatments that leave an hydrogen terminated surface, they report that the acidic etching following the hydrogen plasma treatment renders the surface oxygen terminated, which has been shown to enhance the formation of $NV^-$. It is also reported that the post FIB processing steps decrease surface roughness by 25%.

In Shuji Kiyohara and Iwao Miyamoto 1996 Nanotechnology 7 270 doi:10.1088/0957-4484/7/3/017 a method of processing diamond materials is reported including reactive ion beam machining of diamond using an electron cyclotron resonance (ECR)—type oxygen source. It is reported that the machining rate increases with increase in ion energy, reaches a maximum rate at an ion energy of 300 eV, then decreases gradually with further increase in ion energy. Furthermore, the surface roughness of diamond before and after oxygen ion beam machining was evaluated using an atomic force microscope (AFM) and a scanning electron microscope (SEM). It was found that the surface roughness increases with increase in ion incident angle, and decreases with increase in ion energy.

In K Tsuchiya et al 1995 Nanotechnology 6 158 doi: 10.1088/0957-4484/6/4/009 it is further reported that in order to improve surface roughness of lapped material ion beam machining can be performed using argon ions and oxygen ions. It is reported that application of oxygen ion machining after removing the oxidized surface layer was effective for decreasing surface roughness.

Whetten, Journal of Vacuum Science & Technology A: Vacuum, Surfaces, and Films, Volume: 2, Issue: 2, Page(s): 477-480 also reports the Etching of diamond with argon and oxygen ion beams.

The most appropriate surface processing technique will depend on the end application, the type of surface finish required for the end application, and commercial considerations including an evaluation of the cost of a particular processing technique versus the commercial value of the product obtain after such processing. Surface processing parameters of interest may include one or more of: roughness; flatness; curvature; surface/sub-surface crystal damage; speed; cost; precision; and repeatability.

Prior to discussing embodiments of the invention in more detail, it may be pertinent to clarify the distinction between flatness and roughness, particularly in the context of synthesis and processing of super-hard materials such as synthetic diamond materials. In this regard, a skilled person will understand that flatness and roughness are two different characteristics of a surface and particular applications will be sensitive to either one or both of these characteristics. For example, a smooth curved surface has low roughness but it not flat as illustrated in FIG. 1 whereas a rough non-curved surface may be flat but have a high degree of roughness as illustrated in FIG. 2. Roughness is generally the deviation of a surface from a smooth target profile measured on a microscopic scale relative to the scale of the surface area whereas flatness is generally the deviation of a surface from a smooth target profile measured on a macroscopic scale relative to the scale of the surface area. The two parameters are thus distinguished by the method of measuring deviations from a smooth surface profile with roughness being measured by a technique which determines deviations from the smooth surface profile at a microscopic scale and flatness/curvature being measured by a technique which determines deviations from a smooth surface profile at a macroscopic scale. For a wafer of material having two opposing surfaces then surface parallelism may often also be an important additional parameter.

In light of the above, it will be evident that a surface which has low roughness may still deviate significantly from a smooth target profile due to macroscopic deviations from the smooth target profile. For example, FIG. 3 shows a schematic illustration of a wafer of super-hard material which has a surface profile which is bowed from a targeted smooth flat configuration. Furthermore, if the target profile is flat then a low surface roughness surface can still deviate significantly from a smooth flat target profile due to non-perpendicular surface processing leading to a sloped or wedge-shaped profile as illustrated in FIG. 4. Similar deviations to those illustrated in FIGS. 3 and 4 for flat surface can also occur when a curved surface profile is desired.

Such deviations from a target profile may be caused by stress introduced into the super-hard material during synthesis and/or during surface processing which can lead to bowing in a super-hard material Furthermore, macroscopic deviations from a smooth target profile may also result due to non-uniform processing.

The aforementioned issues are typically more problematic for super-hard materials when compared to less hard materials for a number of reasons as discussed below.

First, synthesis conditions for super-hard materials are often extreme, e.g. very high pressures and/or temperatures, leading to stress in the synthesized super-hard material which can cause bowing.

Secondly, the extreme hardness of super-hard materials typically requires a large amount of energy to be imparted to process a surface of the material and this generates heat leading to the generation of thermal stress during processing which can again lead to bowing.

Thirdly, due to the extreme hardness of super-hard materials, abrasive particles can be broken down into smaller particles during processing of a super-hard material which can result in differential processing of, for example, central and outer regions of a wafer of super-hard material.

Fourthly, the extreme hardness of super-hard materials typically requires a large force do be applied to the super-hard material during processing and if this force isn't uniformly applied across the surface of the super-hard material during process a sloped or wedge-shaped profile can result.

In addition to the above, even if a smooth, flat surface can be achieved by a particular surface processing method, or a combination of surface processing methods, problems may still exist in terms of crystal defects/damage being imparted into the crystal surface and sub-surface. FIG. 5 illustrates a super-hard material having a smooth and flat surface but where microcracks have been formed in a surface region due to forces imparted during the processing of the surface to a high degree of smoothness and flatness. This is a particular problem for super-hard materials due to the high hardness and low toughness of such materials. Several different methods are available for measuring surface and sub-surface crystal damage. For example, one technique involves applying a revealing plasma etch to the processed surface which preferentially etches cracked or damaged regions to form etch pits which can then be counted to evaluate the density of defects at the processed surface.

In light of the above, it is evident that while it is desirable for many applications to form low roughness and highly flat or precisely curved surfaces without imparting defects/damage into the crystal structure there are many problems associated with forming such surfaces in super-hard materials.

Embodiments of the present invention are primarily concern with processing of diamond and related super-hard materials to extreme levels of flatness or precisely defined curvatures. Such extremely levels of precision in terms of flatness or curvature are desirable for certain optical applications and certain electronic applications. While extremely levels of precision in terms of flatness or curvature have been achieved to date for many other materials, the nature of super-hard materials in terms of their extreme hardness and low toughness makes the acquisition of such surface finishes in super-hard materials very difficult to achieve in practice. It is an aim of certain embodiments of the present invention to solve this problem. It is a further aim of certain embodiments of the present invention to achieve extremely levels of precision in terms of flatness or curvature for super-hard materials while also providing a processing method which is cost efficient and reproducible over relatively large areas. It is yet a further aim of certain embodiments of the present invention to achieve extremely levels of precision in terms of flatness or curvature for super-hard materials while also providing addition advantageous surface and sub-surface characteristics including low roughness and low crystal damage.

SUMMARY OF INVENTION

According to a first aspect of the present invention there is provided a method of processing a super-hard material having a Vickers hardness of no less than 2000 kg/mm$^2$, the method comprising:
(a) forming a surface of the super-hard material to have a first surface profile within a first root mean square deviation from a smooth target surface profile, said first root mean square deviation being no more than 5 µm;
(b) analysing said surface of the super-hard material to detect a plurality of protruding regions on said surface; and
(c) selectively processing over only the protruding regions on the surface of the super-hard material to form a second surface profile within a second root mean square deviation from the smooth target surface profile, said second root mean square deviation being less than 100 nm.

According to a second aspect of the present invention there is provided a super-hard material comprising:
a Vickers hardness of no less than 2000 kg/mm$^2$;
a largest linear dimension of at least 10 mm; and
a surface profile with a root mean square deviation from a smooth target surface profile, said root mean square deviation being less than 100 nm.

According to a third aspect of the present invention there is provided a single crystal super-hard material comprising:
a Vickers hardness of no less than 2000 kg/mm$^2$;
a largest linear dimension of at least 6 mm; and
a surface having a surface profile with a root mean square deviation from a smooth target surface profile, said root mean square deviation being no more than 30 nm.

According to a fourth aspect of the present invention there is provided a super-hard material comprising:
a Vickers hardness of no less than 2000 kg/mm$^2$;
a largest linear dimension of at least 1 mm; and
a surface profile with a root mean square deviation from a smooth target surface profile, said root mean square deviation being less than 2 nm.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

FIGS. 1 to 5 have already been discussed in the background section of this specification and serve to illustrate some different types of surfaces which can be generated during synthesis and processing of a super-hard material. Particular problems in processing super-hard materials have also been discussed in the background section and the desire to develop improved surface processing methodology for super-hard materials in order to achieve highly precise surface finishes which are desirable for certain applications such as certain optical and electronic applications.

Figure 1:
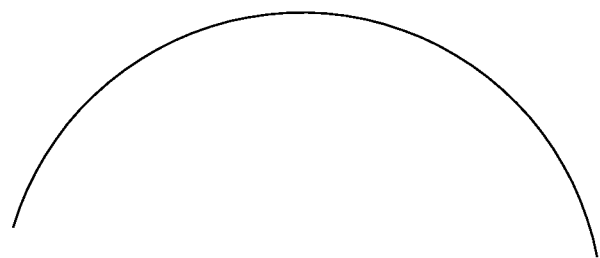
FIG. 1 shows a smooth curved surface.
Figure 2:
FIG. 2 shows a flat rough surface.
Figure 3:
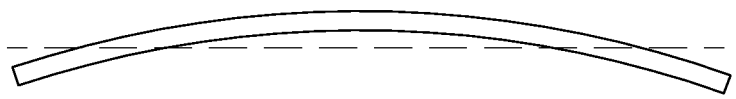
FIG. 3 shows a schematic illustration of a wafer of super-hard material which has bowed from a targeted flat configuration due to stress induced during synthesis and/or surface processing and/or due to non-uniform processing.
Figure 4:
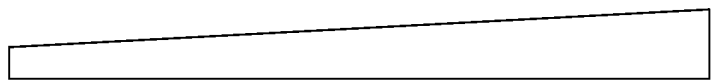
FIG. 4 shows a schematic illustration of a wafer of super-hard material which has a wedge shaped profile deviating from a targeted flat configuration due to non-uniform processing.
Figure 5:
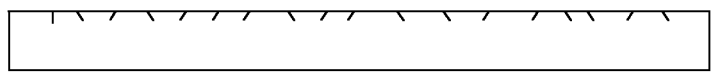
FIG. 5 shows a schematic illustration of a wafer of super-hard material which has a smooth flat surface profile which comprises surface damage in the form of microcracks introduced during surface processing.
Figure 6:
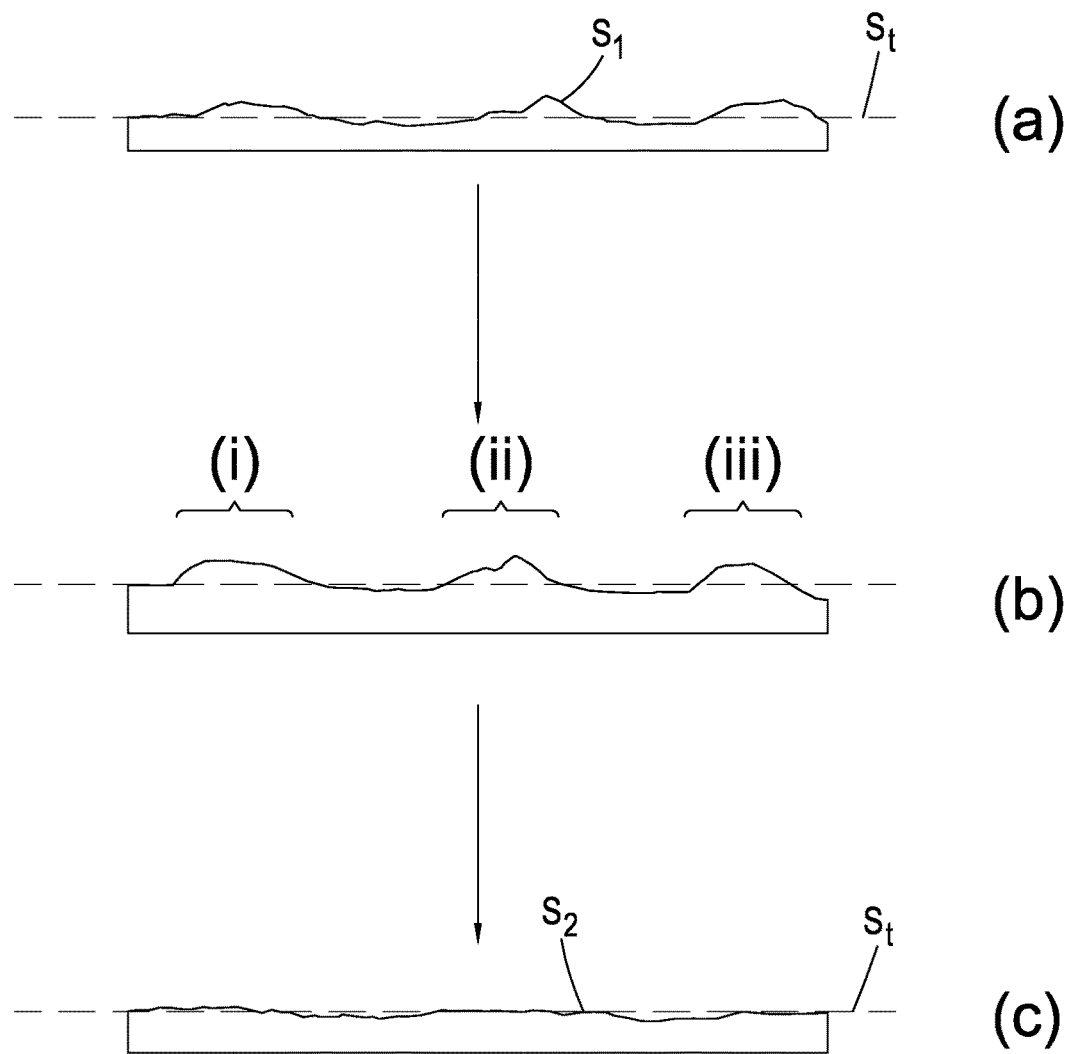
FIG. 6 shows a flow diagram illustrating a multi-step surface processing technique for processing a super-hard material according to an embodiment of the present invention.

Embodiments of the present invention have been developed to address the aforementioned problems. As described in the summary of invention section and illustrated in FIG. 6, a first aspect of the present invention provides a multi-step surface processing technique for processing a super-hard material to a high degree of precision. The method comprises:

(a) forming a surface of the super-hard material to have a first surface profile $S_1$ within a first root mean square deviation from a smooth target surface profile $S_t$, said first root mean square deviation being no more than 5 μm;

(b) analysing said surface of the super-hard material to detect a plurality of protruding regions (i), (ii), (iii) on said surface; and (c) selectively processing over only the protruding regions on the surface of the super-hard material to form a second surface profile $S_2$ within a second root mean square deviation from the smooth target surface profile $S_t$, said second root mean square deviation being less than 100 nm.

In relation to the above, the protruding regions on the surface of the super-hard material are sub-regions of the surface which comprise a protrusion and selectively processing over only the protruding regions means that only the sub-regions of the surface which comprise protrusions are processed in step (c). This will mean that only the protrusions, or at least only the protrusions and regions immediately surrounding the protrusions, will be processed in step (c).

The aforementioned method is based on the finding that it is very difficult to process a surface of a super-hard material to have a surface profile with a root mean square deviation of significantly less than 1 μm from a smooth target surface profile in a reliable, consistent, time efficient, and cost effective manner. Typically super-hard materials are processed using lapping and polishing techniques, each of which process one entire surface simultaneously. As described in the background section, super-hard materials are particularly problematic to process due to their extreme hardness, low toughness (i.e. high brittleness), and internal stresses. While finer and finer abrasive particles can be used to move towards more precise surface finishes, chipping, cracking, and/or thermal induced warping of the super-hard material means that there is no guarantee that a highly precise target surface profile will be achieved, even after many days of processing.

In light of the above, one possibility is to analyse the surface of the super-hard material to detect deviations from a target profile and then selectively process individual regions, rather than the entire surface, such that differential targeted processing is utilized to achieved the desired surface profile. Such a method is more controllable, reliable, and consistent at achieving a highly precise surface finish as the processing of individual selected regions requires less energy, lower applied forces, and generates less heat. However, one problem with this approach is that although the energy and applied force required to process a selected region on the surface of a super-hard material will be lower, the required energy and/or force will still be very high for super-hard materials and applying this to only a small area of the super-hard materials can lead to non-uniform stress which itself can damage the super-hard material and/or cause deviations from the target surface profile. A further problem is that it can be very time consuming and expensive to perform the selective surface processing, particularly over a relatively large surface area which requires a large number of individual areas to be selectively processed.

The present inventors have realized that these problems can be alleviated by ensuring that the surface of the super-hard material is initially prepared such that it is has a standard deviation of no more than 5 μm relative to a smooth target surface profile prior to analysis of the surface and the application of selective processing of individual regions to achieve the desired surface profile required for certain extreme optical and electronic applications. This methodology has been found to provide a reliable, consistent, time efficient, and cost effective route to achieving high precision surface finishes on super-hard materials.

The exact level of precision required for the initial surface preparation and the final surface after selective processing will depend to some extent on the specific processing techniques used to generate the surfaces at the various stages of processing and the required level of precision for a particular end application. For example, the initial surface profile may be prepared to have a root mean square deviation from a smooth target profile which is no more than 3 μm, 1 μm, 500 nm, 100 nm, 50 nm, 20 nm, or 10 nm. The root mean square deviation of this initial surface profile may also be no less than 5 nm, 10 nm, or 15 nm. The final surface profile after selective processing may be prepared to have a root mean square deviation from the smooth target profile which is no more than 60 nm, 40 nm, 20 nm, 15 nm, 10 nm, or 5 nm.

In the above discussion the flatness of a surface profile has been defined in terms of root mean square deviation from a smooth target profile. In optical applications, flatness is often defined in terms of the operating or reference wavelength λ. For example, for certain optical applications a flatness specification of no more than λ/10 or more preferably λ/20 is desirable (i.e. no more than 60 nm or more preferably no more than 30 nm for λ=532 nm). This level of flatness requires non-standard processing including, for example, optimized mounting for lapping and polishing, control of thermal distortions via low temperature and low pressure polishing, and/or via use of non-flat polishing wheels to account for thermal deformations, and/or post-polishing identification of protruding regions which are selectively processed back after polishing as described herein. New low temperature surface processing techniques such as chemo-mechanical polishing (CMP) may also be useful.

For certain applications it is also desirable to provide a surface finish which has a low surface roughness in addition to a high degree of flatness or a precisely defined curvature. In practice, it has been found that certain selective processing techniques can lead to an increase in microscopic surface roughness. That is, while macroscopic flatness or curvature is improved by the selective processing, microscopic roughness actually is increased by the selective processing relative to the initially prepared surface prior to application of selective processing. Accordingly, where a low surface roughness is desirable in combination with a higher degree of flatness a precisely defined curvature then it is advantageous to prepare the initial surface to have a very low surface roughness. As such, any increase in roughness due to selective processing will still retain a relatively low roughness surface. Further still, it is advantageous to apply a selective processing technique which does not unduly increase the surface roughness of the super-hard material. By ensuring that the initial surface is already within a specified flatness or curvature the level of selective processing to achieve the final surface profile is lower and thus the increase in surface roughness can be made lower. The exact surface roughness will depend on the specific surface processing techniques which are utilized and the surface roughness which is desired for a particular end application. For example, after selective processing, the surface of the super-hard material may have a surface roughness $R_a$ of no more than 20 nm, 15 nm, 10 nm, 5 nm, 3 nm, or 1 nm.

The surface processing methodology as described herein is capable of generating highly flat or precisely defined curved surface over large areas of super-hard material in a reliable, consistent, time efficient, and cost effective manner. For example, the surface of the super-hard material may have at least one linear dimension of at least 10 mm, 20 mm, 40 mm, 60 mm, 80 mm, 100 mm, 120 mm, or 140 mm. As previously described, it has been found to be difficult to obtain precisely defined surface profiles for super-hard materials using processing techniques which process an entire surface area in a single processing step. This is particularly problematic for larger surface areas and thus embodiments of the present invention are particularly advantageous when a precisely defined surface profile is required over a relatively large area of super-hard material.

The smooth target surface profile may be a flat surface, a convex surface, or a concave surface. Highly flat surfaces are useful for optical windows and prisms whereas convex and/or concave surfaces are required for optical mirror and lens elements. Highly flat surfaces also lend themselves to direct Van der Waals bonding without the need for additional adhesive material. This can be useful for bonding super-hard materials into electronic and optical device to function, for example, as thermal heat spreaders.

Initial Surface Processing

A number of different surface processing techniques may be used to generate the initial surface profile prior to application of selective surface processing. Processing techniques include one or more of: direct growth; cutting; lapping; polishing; chemo-mechanical polishing; ablating; electric discharge machining; and etching.

Relatively flat growth surfaces can be achieved for single crystal super-hard materials. Additionally, the nucleation surface of an as-grown single crystal or polycrystalline super-hard material can be made relatively flat if the surface of the substrate on which the material is grown is processed to a high degree of flatness and temperature variations across the substrate are controlled during growth so as to minimize thermally induced stresses.

While for certain growth processes it is possible to generate a sufficiently well-defined surface to function as the starting surface for selective processing, in practice as-grown super-hard material will usually be cut, lapped, and then polished to generate the surface to which selective processing is then applied.

Cutting is usually achieved using a laser although other cutting techniques such as electron beam cutting can be used. Further still, if the super-hard material is electrically conductive it may be cut using electric discharge machining.

Lapping is them performed to generate an approximate surface profile. In a standard lapping process a super-hard material is mounted on a rotatable processing wheel. An abrasive slurry comprising super-hard abrasive particles within a carrier fluid is dripped onto the surface of the processing wheel from above. Generally, the abrasive slurry is dripped onto the processing wheel near a central region thereof and the abrasive slurry moves radial outwards across the processing wheel during rotation of the processing wheel in use. For a rough lapping process where a significant amount of material is to be removed from a surface of the super-hard material product, the super-hard abrasive particles may be relatively large in size, e.g. having a particle size of greater than 1 µm. These abrasive particles are larger than pores within the surface of the processing wheel and thus roll between the surface of the processing wheel and the surface of the super-hard material within an interface region in order to cause surface micro-cracking of the super-hard material and removal of material from the surface of the super-hard material.

One problem with the aforementioned lapping configuration is that the lapping process can be difficult to control in order to achieve high rates of material processing without causing undue damage to the surface of the super-hard material being processed. Furthermore, another problem with the aforementioned lapping configuration is that the lapping process can be difficult to obtain uniform processing across large areas of super-hard material.

Figure 7:
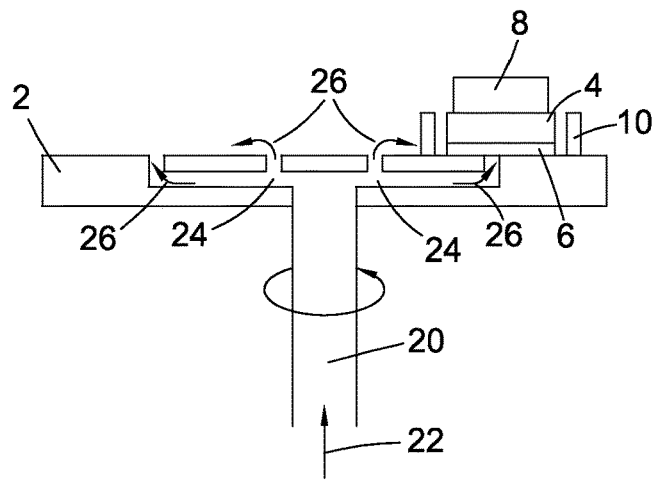
FIGS. 7 and 8 show schematic illustrations of a lapping apparatus for performing an initial surface processing step.
Figure 8:
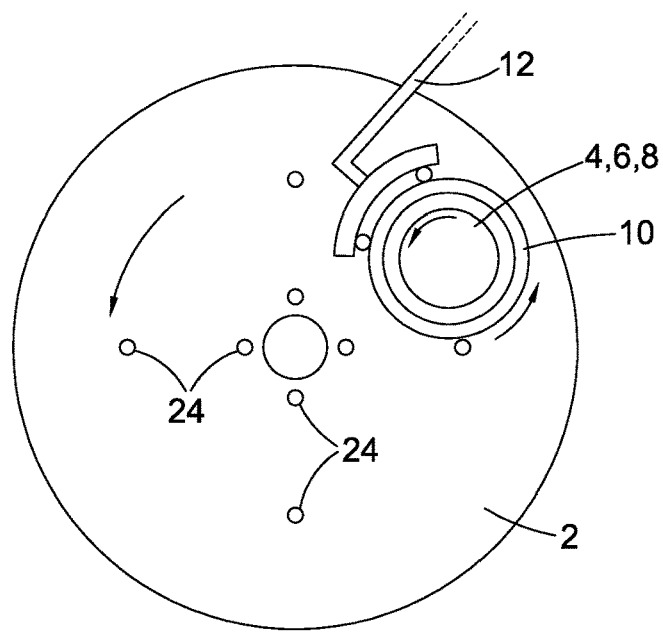

FIGS. 7 and 8 illustrate a lapping apparatus configured to solve the aforementioned problems. The apparatus comprises a rotatable processing wheel 2 on which a super-hard material product to be processed is mounted. The mounting configuration may comprise a carrier substrate 4 mounted to the super-hard material 6 such that a loading force is applied to the super-hard material 6 via the carrier substrate 4. For example, the super-hard material 6 may be bonded to the carrier substrate 4. Alternatively, the super-hard material may be retained in a free-standing configuration which is not bonded to a carrier substrate.

The super-hard material 6 is adhered to a carrier substrate 4 and arranged such that a surface of the super-hard material is in contact with a surface of the processing wheel 2 with an interface region disposed between the surface of the super-hard material 6 and the surface of the processing wheel 2. A weight 8 is provided on the carrier substrate 4 such that the super-hard material 6 is pressed against the surface of the processing wheel 2 with a suitable loading force. In an alternative configuration a pneumatic arrangement can be utilized to apply the loading force in place of the weight 8.

As in the previously described arrangement, the carrier substrate 4 (if present) and the super-hard material product 6 can be mounted on the processing wheel within a constraining ring 10 which constrains a location of the super-hard material product 6 over the processing wheel 2. The constraining ring 10 may comprise a number of slots for allowing the passage of abrasive fluid therethrough although it is possible to utilize a constraining ring which does not comprise slots. The constraining ring 10 has an internal diameter which is larger than the diameter of the super-hard material product 6 and carrier substrate 4. Furthermore, both the constraining ring 10 and the super-hard material product 6 are mounted so as to rotate on the surface of the processing wheel 2 driven by rotation of the processing wheel. In the illustrated configuration the constraining ring 10 is rotatable mounted on the processing wheel 2 via constraining arm 12. In certain configurations the constraining ring 10 and/or the super-hard material product 6 are rotatably driven independently of the processing wheel 2 and this can be desirable to provide a controlled rotation of the constraining ring 10 and/or the super-hard material product 6 relative to the processing wheel 2. In this case, the constraining arm 12 may comprise driven wheels for rotating the constraining ring 10 and/or the super-hard material product 6. Alternatively, a rotating force may be applied from directly above the super-hard material product 6, e.g. via an upper surface of the super-hard material product 6, the carrier substrate 4, the weight 8, and/or via a pneumatic loading configuration if present.

The apparatus of FIGS. 7 and 8 is thus configured to provide an under-feed arrangement for the abrasive slurry. Abrasive slurry is fed upwards through a rotational post 20 as illustrated by arrow 22. The processing plate 2 is adapted to provide a plurality of feed ports 24 disposed in the surface thereof such that in use an abrasive slurry is fed through the feed ports 24 onto the surface of the processing wheel from underneath the processing wheel as illustrated by arrows 26. The abrasive particles then move radial outwards from the feed ports 24 across the surface of the processing wheel 2 and roll through the interface region between the super-hard material product 6 and the processing wheel 2 in order to cause surface micro-cracking of the super-hard material product and removal of material from the surface of the super-hard material product.

The plurality of feed ports 24 can be radially distributed across the surface of the processing wheel such that at least a portion of the abrasive slurry is fed directly from the feed ports into the interface region between the surface of the processing wheel and the surface of the super-hard material product being processed.

Surprisingly, it has been found that higher rates of material processing can be achieved in a much more controllable manner using a lapping configuration in which the surface of the processing wheel has one or more feed ports disposed therein and the abrasive slurry is fed through the feed ports during processing of the super-hard material product onto the surface of the processing wheel from underneath the processing wheel rather than dripped onto the surface of the processing wheel from above as is done in a more standard lapping configuration. A better surface finish is also achieved, especially for large polycrystalline CVD diamond wafers when compared with a top feed approach. While not being bound by theory, it is believed that the under-feed configuration is advantage over the top-feed configuration for the following reasons.

Using a top feed approach all abrasive particles entering an interface region between the surface of the processing wheel and the surface of the super-hard material must do so from an edge of the super-hard material. It has been found that this can lead to edge chipping, edge rounding, and/or groove formation across the surface of the super-hard material being processed. In contrast, if the abrasive slurry is under-fed then at least a portion of the slurry can be introduced directly under the super-hard material being processed in the interface region. As such, this abrasive material moves from a central region of the super-hard material to an edge region rather than from an edge region to a central region. It has been found that such a modified lapping technique reduces edge chipping, edge rounding, and grooving in the super-hard material being processed and thus can lead to a better surface finish. In addition, regardless of the direct under-feed to interface region configuration, it is also believed that generally an under-feed configuration allows the abrasive slurry to be introduced onto the surface of the processing wheel at a more controllable rate and optionally in a continuous stream.

In addition to the above, it is also possible using the modified lapping process to achieve more uniform processing across a large surface of a super-hard material such as a polycrystalline CVD diamond wafer. As previously indicated, standard lapping techniques involve dripping a suspension of diamond grit onto the lapping wheel from above. However, using such a technique requires grit to move into a peripheral region of the interface between the lapping wheel and a polycrystalline CVD diamond wafer and then propagate across the interface region in order to process the surface of the polycrystalline CVD diamond wafer. The grit particles are broken down as they hit the peripheral region of the wafer and during propagation under the wafer. This can result in differential processing of peripheral and central regions of the wafer with central regions being processed by smaller particles of grit than peripheral regions. This problem is particular to processing of super-hard materials, such as diamond wafers, as other materials do not cause the diamond grit to be broken down into smaller particles. As previously described, in order to solve this problem the lapping apparatus has been modified to feed the suspension of diamond grit from an underside of the lapping wheel through holes in the lapping wheel at locations which result in the grit being fed directly into the interface region between the wafer and the lapping wheel. As such, using this arrangement it is possible to avoid differential processing of peripheral and central regions of the wafer.

After lapping, the super-hard material may be optionally polished and this is particular desirable when a low surface roughness is required. As described in the background section, polishing is a two-body surface processing technique in which abrasive material is fixed in a polishing wheel such as via resin bonding. Polishing may also be achieved using an iron or steel wheel which is diamond impregnated and this is known as scaife polishing. Although scaife polishing generally utilizes free diamond abrasive particles these are of a small size relative to pores within the iron or steel wheel and are thus embedded/fixed into the wheel thus effecting a two-body processing as opposed to a true three body lapping process. If a dry polishing technique is utilized on a super-hard material this can generate a significant amount of heat which can introduce thermal stress and warping of the super-hard material. Accordingly, the polishing parameters may be controlled, e.g. by utilizing a low pressure polishing technique, to alleviate heat generation and avoid such thermal warping when a precisely defined surface flatness or curvature is desired in accordance with embodiments of the present invention. Additionally, or alternatively, the polishing wheel may be shaped to compensate for thermally induced stresses produced during polishing. For example, a slight curvature may be introduced into the polishing wheel such that when the processed super-hard material is removed after polishing, thermally induced stress causes the polished material to be pulled into a flat configuration. Alternatively still, a lower temperature wet polishing technique such as a chemo-mechanical polishing technique may be utilized to avoid thermally induced stress and warping of the super-hard material away from a desired smooth target profile. As described in the background section, chemo-mechanical processing (CMP) techniques combine mechanical and chemical processing mechanisms utilizing CMP slurries including abrasive grit particles and chemical components which react with the surface of the super-hard material being processed to change the chemical composition of the surface making it easier to remove.

As an alternative, or in addition to the aforementioned lapping and polishing techniques, the super-hard material may be processed using an etching technique such as plasma etching using suitable gas chemistries including, for example, one or more of hydrogen, oxygen, argon (or other inert gases), and chlorine (or other halides). As described in the background section, an example of an etching technique for achieving low surface roughness diamond surface finishes is described in WO2008/090511.

Mounting Configurations for Processing

In addition to the use of an under-feed lapping and polishing techniques as described above, the present inventors have also developed a number of simple and effective mounting configurations for ensuring that highly flat surface finishes can be achieved. For example, it has been found to be advantageous to use an ultra-flat carrier substrate (e.g. one which has a surface flatness of better than 5 µm). Furthermore, it has been found to be advantageous to use a very low viscosity adhesive to mount the super-hard material product to the carrier substrate. Use of a low viscosity adhesive avoids the adhesive drying with a non-uniform flatness which introduces non-uniformities in the reference surface to which the super-hard material product is adhered. Such non-uniformities can result in non-uniformities in the flatness of the super-hard material being processed. It is further advantageous to use adhesive which has a low thermal expansion coefficient to avoid non-uniformities being introduced due to expansion of the adhesive during processing. That said, while low viscosity, low thermal expansion coefficient adhesives have been found to be useful for mounting super-hard material products for processing, another alternative is to leave the super-hard material product in an un-bonded state.

Figure 9:
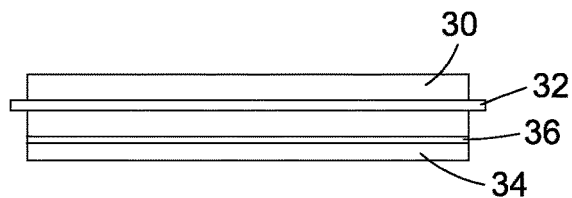
FIG. 9 shows a cross-sectional view of a carrier substrate with a super-hard material mounted thereto for processing.

A suitable mounting configuration for the super-hard material to be processed is illustrated in FIG. 9. The mounting configuration comprises a carrier plate 30 having an ultra-flat surface. The carrier plate 30 may be formed from a number of different materials including invar, silicon carbide, silicon cemented diamond, quartz, or borosilicate glass. Ideally, the carrier plate 30 should be made of a material which has a low thermal expansion coefficient and which is capable of being processed to a high degree of flatness. The material of the carrier plate is also preferably stiff and has a high thermally conductivity. The more stiff the carrier plate is then the less it will distort under loading and consequently the less the super-hard material is able to distort during processing. Furthermore, the more efficient the carrier plate is at spreading heat, the more uniform the temperature of the super-hard material will be during processing thus minimizing thermal distortions. Further still, a lower thermal expansion coefficient will lead to less thermally induced non-uniformities. Any form effects caused by temperature and load can be transmitted to the super-hard material being processed limiting the accuracy of the surface processing.

The carrier substrate may be cylindrical in shape and may comprise an o-ring 32 disposed around a peripheral surface thereof. The o-ring 32 is advantageous to protect the carrier in use where it abuts against a constraining ring as previously described. A super-hard material product plate 34 is mounted to the ultra-flat surface of the carrier plate 30, e.g. via a low viscosity adhesive 36. While in FIG. 6 the super-hard material product plate 34 has a diameter substantially equal to that of the carrier plate 30, in practice the diameter of the super-hard material product plate 34 may often be smaller than that of the carrier plate 30.

One mounting technique involves pressing a wafer of super-hard material onto a carrier substrate (nucleation face down as this provides the smoothest, flattest reference face when compared with the growth face which is rough and comprises larger particles) and beading glue around the edge of the wafer. The glue is drawn into the interface between the wafer and the carrier substrate around a peripheral region by capillary action and sets to adhere the wafer to the carrier substrate. If the wafer or the substrate is not sufficiently flat then glue may be drawn into a more central region of the interface which is not desirable as flatness is compromised. What is desired is a very small volume of glue within the interface region only around a peripheral region. The glue must be a low viscosity adhesive in order to be drawn into the interface and set in the required manner. The glue must also be capable of withstanding the temperatures generated during lapping and polishing in order to retain adhesion during processing. After processing one surface, the substrate-wafer composite is heated to soften the glue and release the wafer which is then turned over and re-adhered to the carrier substrate for processing the nucleation face of the wafer.

While the above described mounting configuration is suitable for processing flat super-hard material products, the surface processing as described herein may also be utilized for non-planar super-hard material products. In this case the working surface of the processing wheel may be curved and the carrier plate may also be curved to provide a suitable mounting configuration and processing surface for a non-planar super-hard material product such a dome or lens.

In addition to the above, it has also been found that in certain cases it is advantageous to use ultra-hard processing wheels for mechanical processing of super-hard surfaces to high flatness and low roughness. For example, it has been found that it is incredibly difficult to achieve ultra-flat processing of single crystal diamond parts using standard scaife polishing which typically incorporates a ring shape into the diamond material due to the shape of the processing wheel. For this reason, no amount of wheel preparation enables exceptionally flat surfaces to be formed on single crystal diamond using traditional iron scaifes. Accordingly, it has been found that ultra-hard polishing wheels can be advantageous. These can be formed from diamond composite materials such as syndite and the exceptional flatness and smoothness of the syndite material can be used to polish diamond to high degrees of flatness. In this case, it has been found that a soft backing material for the part(s) being processed can be advantageous to prevent significant subsurface damage bring incorporated into the super-hard material during processing. A floating holder may be used to ensure flat finishes that conform to the shape of the processing wheel. In addition, multiple single crystal parts, or multiple small polycrystalline diamond parts, can be prepared at once using a plurality of floating holders. Further still, for high levels of parallelism a mount can be pre-ground against a syndite wheel to provide a reference face. An already processed diamond face can then be adhered to this reference face and brought into contact with the syndite wheel. By using this approach diamond parts can be made with a high degree of parallelism.

Selective Processing

After preparing a surface of a super-hard material by, for example, lapping and polishing as described above, the surface can be analysed to detect any protruding regions on said surface. For example, the optical industry standard method to measure flatness and roughness is by interferometry at 632.8 nm. This method can also be used to produce a topographic map of the surface of the super-hard material to detect any protruding regions on said surface.

After detection of protruding regions as described above, these protruding regions can be selectively processed back. Selective processing may be achieved by one of: a focused beam such as a laser beam, an electron beam, or a focused ion beam; a targeted electric discharge; a masked etch; or a mechanical or chemo-mechanical polishing pad which is smaller in area than the surface of the super-hard material being processed such that selective processing over only protruding regions on the surface of the super-hard material is achieved.

The selective processing may be performed in a number of different ways. One method comprises calculating an amount of processing at each of the plurality of protruding regions required to form the final surface profile and then applying the calculated amount of processing at each of the plurality of protruding regions to form the final surface profile. Additionally, or alternatively, the selective processing method may comprises measuring one or more of the protrusions during the selective processing procedure and controlling the selective processing based on these measurements. Further still, surface analysis and selective processing may be performed iteratively in order to generate the final surface finish in a controlled manner.

The selective processing may also be applied in a sequential, simultaneous, or pseudo-pulsed manner.

Figure 10:
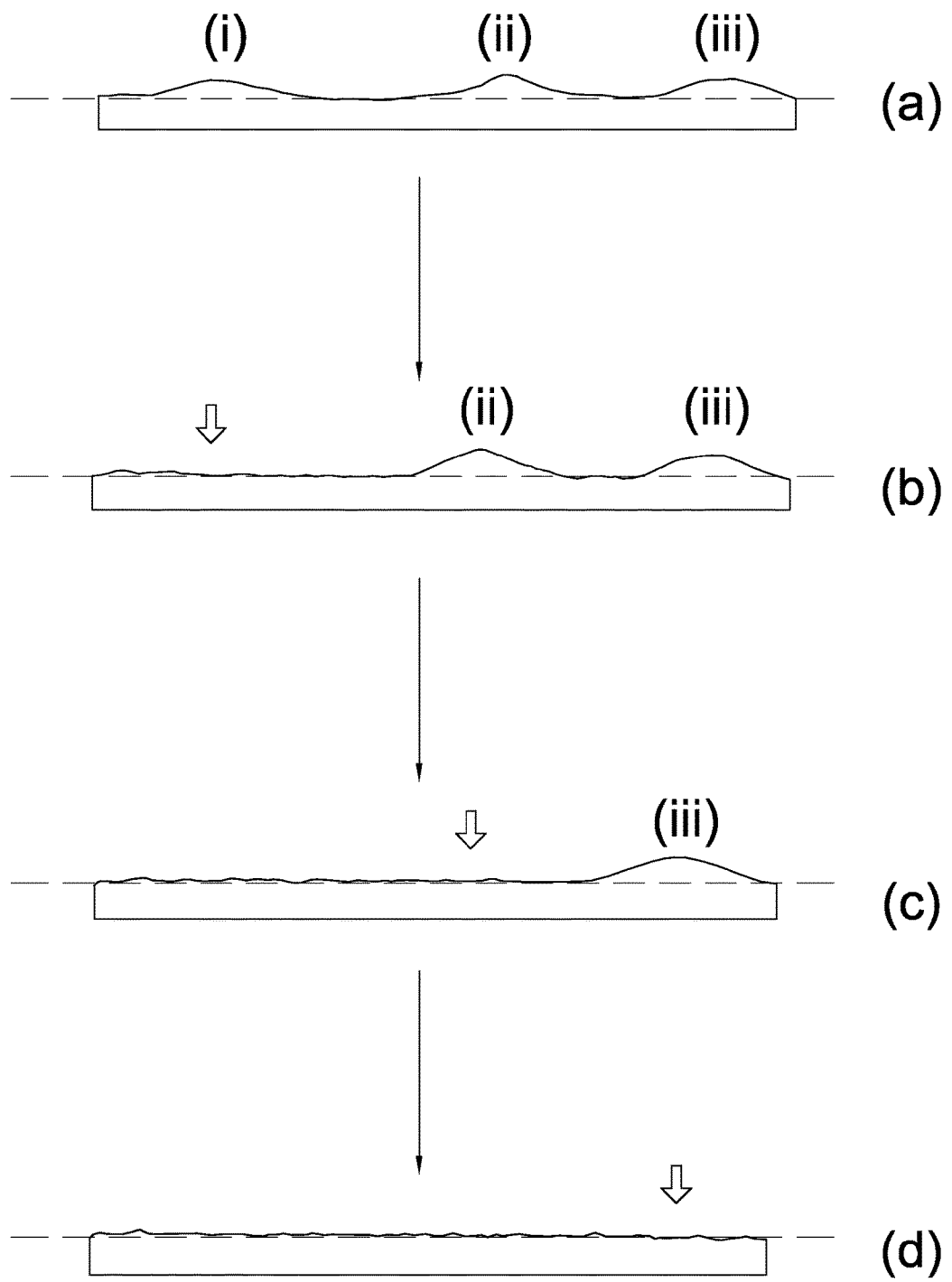
FIG. 10 shows a flow diagram illustrating a sequential processing method for achieving a selective processing of a super-hard material towards a target profile.

In a sequential processing method, a protruding region is processed to within a required deviation from the smooth target surface profile before moving to a subsequent protruding region which is processed to within a required deviation from the smooth target surface profile, the process being repeated until all the protruding regions have been processed once at which point the second surface profile is formed. This methodology has the advantageous of being relatively simple to implement and requires only a single processing beam or polishing pad. FIG. 10 shows a flow diagram illustrating a sequential processing method for achieving a selective processing of a super-hard material towards a target profile. Three protrusions (i), (ii), (iii) are initially identified as illustrated in FIG. 10(a). The first protrusion (i) is processed as shown in FIG. 10(b), the second protrusion (ii) is then processed as shown in FIG. 10(c), and finally the third protrusion (iii) is processed as to yield a highly flat surface as shown in FIG. 10(d)

Figure 11:
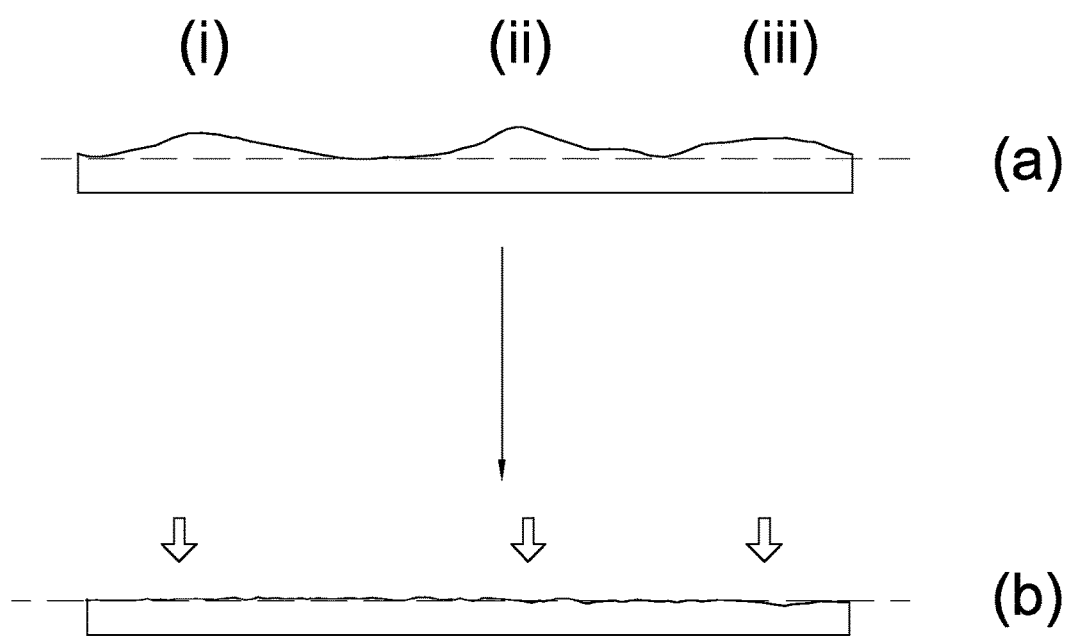
FIG. 11 shows a flow diagram illustrating a simultaneous processing method for achieving a selective processing of a super-hard material towards a target profile.

In a simultaneous processing method, the plurality of protruding regions are processed to within a required deviation from the smooth target surface profile simultaneously using a patterned processing technique to form the final surface profile. The patterned processing technique may involve a masked etch or may alternatively involve the simultaneous application of multiple processing beams to the surface of the super-hard material. This methodology has the advantageous of being potentially faster than the sequential processing method but is more complex to implement. FIG. 11 shows a flow diagram illustrating a simultaneous processing method for achieving a selective processing of a super-hard material towards a target profile. Three protrusions (i), (ii), (iii) are initially identified as illustrated in FIG. 11(a). All three protrusions are then processed simultaneously as illustrated in FIG. 11(b).

Figure 12:
FIG. 12 shows a flow diagram illustrating a pseudo-pulsed processing method for achieving a selective processing of a super-hard material towards a target profile.
Figure 12:
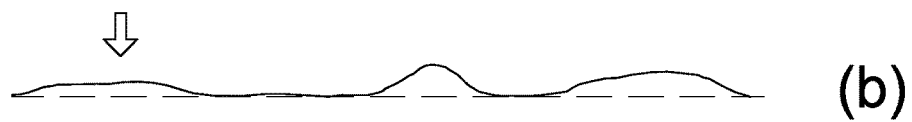
Figure 12:
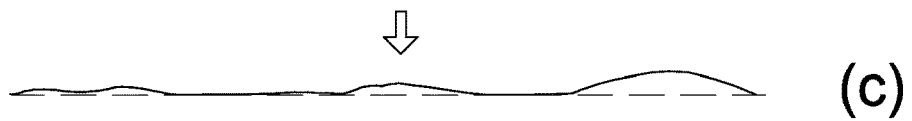
Figure 12:
Figure 12:
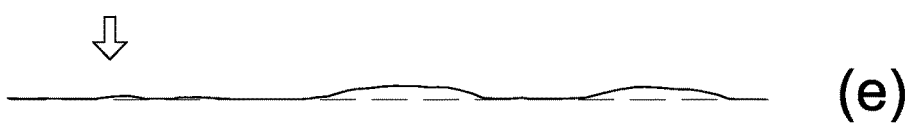
Figure 12:
Figure 12:
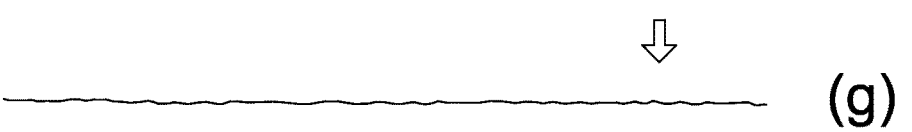

In a pseudo-pulsed processing method, a protruding region is partially processed towards a required deviation from the smooth target surface profile before moving to a subsequent protruding region which is also partially processed towards a required deviation from the smooth target surface profile, the partial processing continuing with partially processed regions being re-processed at least once to form the second surface profile. This methodology has the advantages that continuous processing time at a single location is reduced thus reducing local heat and stress build up which can reduce the possibility of material damage and/or allow a faster rate of processing to be applied. For example, high scanning velocity electron beam processing has been made possible in part by developments in the field of metal welding including developments in electromagnetic steering of electron beams and highly collimated, and optionally pulsed, electron guns for metal welding applications. Electromagnetic electron beam control gives very fast beam manipulation which can be utilized to avoid the super-hard material locally overheating and fracturing. It has surprisingly been found that these developments in metal welding technology are transferable to the field of super-hard materials for cutting applications with remarkable improvements in cutting performance. Such controllable electron beams can be used to apply a pseudo-pulsed processing technique in order to selectively process the surface of a super-hard material. Alternatively, a laser beam or a focused ion beam may be used in such a pseudo-pulsed method of selective processing. A focused ion beam may be steered using electromagnetic control in a similar manner to a steerable electron beam. FIG. 12 shows a flow diagram illustrating a pseudo-pulsed processing method for achieving a selective processing of a super-hard material towards a target profile. Three protrusions (i), (ii), (iii) are initially identified as illustrated in FIG. 12(a). The three protrusions are partially processed in sequence as illustrated in FIGS. 12(b) to 12(d). The three protrusions are then further processed as illustrated in FIGS. 12(e) to 12(g) to achieve the target profile.

As previously described, while selective processing techniques can lead to an increase in surface flatness or a more precisely defined curvature, they can also lead to an increase in microscopic surface roughness which is undesirable for certain applications. Methods of alleviating this problem have previously been described involving the provision of an initial surface profile which has a very low surface roughness and controlling the selective processing such that the surface roughness is not increased beyond the required roughness specification for a particular application. An alternative or additional option for achieving a low roughness surface in combination with a high flatness or precisely defined curvature involves applying a further non-selective surface processing technique to the surface of the super-hard material after selective processing to reduce surface roughness while retaining a surface within the desired flatness or curvature requirements. This final processing stage may comprise a light polishing step to reduce surface roughness without causing a significant deviation from the macroscopic surface profile generated by the selective processing.

One additional advantage of embodiments of the present invention is that they avoid the requirement to apply lapping and polishing steps over extremely long time periods to achieve precisely defined surface profiles in super-hard materials. Such long lapping and processing steps can introduce surface and sub-surface damage into the crystal structure of super-hard materials and this can detrimentally affect functional properties such as optical scatter, laser induced damage threshold, and mechanical integrity.

After the above described surface processing techniques have been performed a cleaning step may also be applied to remove non-super-hard material formed on the surface of the super-hard material during processing. For example, an acid clean may be applied to remove any metal, resin, or non-diamond carbon from the processed surface.

Products

Embodiments of the present invention may be applied to a range of super-hard materials including a range of diamond materials, cubic boron nitride materials (cBN), sapphire, and composites comprising the aforementioned materials. Diamond materials include chemical vapour deposited (CVD) single crystal and polycrystalline synthetic diamond materials of a variety of grades, high pressure high temperature (HPHT) synthetic diamond materials of a variety of grades, natural diamond material, and diamond composite materials such as polycrystalline diamond which includes a metal binder phase (PCD) or silicon cemented diamond (ScD) which includes a silicon/silicon carbide binder phase. Certain embodiments are particular useful for processing synthetic diamond materials such as single crystal and polycrystalline CVD synthetic diamond materials and particularly to such materials over relatively large surface areas.

Utilizing the above described surface processing techniques it is possible to generate super-hard material products which have precisely defined surface profiles over relatively large areas. Accordingly, a one aspect of the present invention provides a super-hard material comprising:

a Vickers hardness of no less than 2000 kg/mm$^2$;

a largest linear dimension of at least 10 mm, 20 mm, 40 mm, 60 mm, 80 mm, 100 mm, 120 mm, or 140 mm;

a surface profile with a root mean square deviation from a smooth target surface profile, said root mean square deviation being less than 100 nm and optionally no more than 60 nm, 40 nm, 20 nm, 15 nm, 10 nm, or 5 nm; and optionally a surface roughness $R_a$ of no more than 20 nm, 15 nm, 10 nm, 5 nm, 3 nm, or 1 nm.

When the super-hard material is a synthetic diamond material, such as optical quality single crystal or polycrystalline CVD diamond material, it can be processed to a high degree of precision without introducing excessive surface and sub-surface crystal damage to form a component having a high laser induced damage threshold for high power laser applications. For example, the processed synthetic diamond material may have a laser induced damage threshold meeting one or both of the following characteristics:

the laser induced damage threshold is at least 30 Jcm$^{-2}$, 50 Jcm$^{-2}$, 75 Jcm$^{-2}$, 100 Jcm$^{-2}$, 150 Jcm$^{-2}$, or 200 Jcm$^{-2}$ measured using a pulsed laser at a wavelength of 10.6 μm with a pulse duration of 100 ns and a pulse repetition frequency in a range 1 to 10 Hz; and the laser induced damage threshold is at least 1 MW/cm$^2$, 5 MW/cm$^2$, 10 MW/cm$^2$, 20 MW/cm$^2$, or 50 MW/cm$^2$ measured using a continuous wave laser at a wavelength of 10.6 μm.

The synthetic diamond material may also have one or more of the following characteristics:

a transmittance of at least 97%, 98% or 99% at an operating wavelength in the infrared, visible, or ultraviolet region of the electromagnetic spectrum when coated with an antireflective coating;

a total integrated scatter in a forward hemisphere no more than 2%, 1%, 0.5%, or 0.1% at the operating wavelength of the optical element;

an absorption coefficient measured at room temperature of ≤0.5 cm$^{-1}$, ≤0.4 cm$^{-1}$, ≤0.3 cm$^{-1}$, ≤0.2 cm$^{-1}$, ≤0.1 cm$^{-1}$, ≤0.07 cm$^{-1}$, ≤0.05 cm$^{-1}$ or ≤0.03 cm$^{-1}$ at 10.6 μm.

an average black spot density no greater than 5 mm$^{-2}$, 3 mm$^{-2}$, 1 mm$^{-2}$, 0.5 mm$^{-2}$, or 0.1 mm$^{-2}$ (where a black spot is a feature larger than 50 microns in area that appears black in transmitted light microscopy on a polished part);

a black spot distribution such that there are no more than 5, 4, 3, 2, or 1 black spots within any 3 mm$^2$ area;

an integrated absorbance per unit thickness of no more than 0.20 cm$^{-2}$, 0.15 cm$^{-2}$, 0.10 cm$^{-2}$, or 0.05 cm$^{-2}$, when measured with a corrected linear background in a range 2760 cm$^{-1}$ to 3030 cm$^{-1}$;

a thermal conductivity of no less than 1800 Wm$^{-1}$K$^{-1}$, 1900 Wm$^{-1}$K$^{-1}$, 2000 Wm$^{-1}$K$^{-1}$, 2100 Wm$^{-1}$K$^{-1}$, or 2200 Wm$^{-1}$K$^{-1}$; and a silicon concentration as measured by secondary ion mass spectrometry of no more than 10$^{17}$ cm$^{-3}$, 5×10$^{16}$ cm$^{-3}$, 10$^{16}$ cm$^{-3}$, 5×10$^{15}$ cm$^{-3}$, or 10$^{15}$ cm$^{-3}$.

In addition to the above, the synthetic diamond material may have one or more of the following characteristics:

a tensile rupture strength with a nucleation face of the synthetic diamond material in tension of: ≥760 MPa×n for a thickness of 200 to 500 μm; ≥700 MPa×n for a thickness of 500 to 750 μm; ≥650 MPa×n for a thickness of 750 to 1000 μm; ≥600 MPa×n for a thickness of 1000 to 1250 μm; ≥550 MPa×n for a thickness of 1250 to 1500 μm; ≥500 MPa×n for a thickness of 1500 to 1750 μm; ≥450 MPa×n for a thickness of 1750 to 2000 μm; or ≥400 MPa×n for a thickness of ≥2000 μm, wherein multiplying factor n is 1.0, 1.1, 1.2, 1.4, 1.6, 1.8, or 2; and a tensile rupture strength with a growth face of the synthetic diamond material in tension of: ≥330 MPa×n for a thickness of 200 to 500 μm; ≥300 MPa×n for a thickness of 500 to 750 μm; ≥275 MPa×n for a thickness of 750 to 1000 μm; ≥250 MPa×n for a thickness of 1000 to 1250 μm; ≥225 MPa×n for a thickness of 1250 to 1500 μm; ≥200 MPa×n for a thickness of 1500 to 1750 μm; ≥175 MPa×n for a thickness of 1750 to 2000 μm; or ≥150 MPa×n for a thickness of ≥2000 μm, wherein multiplying factor n is 1.0 1.1, 1.2, 1.4, 1.6, 1.8, or 2.

It may be noted that extreme levels of surface flatness and roughness become increasingly difficult to achieve as the thickness of the super-hard material decreases and the diameter of the super-hard material increases. Using the methodology as described herein it is possible to achieve the aforementioned levels of roughness and flatness for a super-hard material having a thickness of no more than 1 mm, 800 µm, 600 µm, 400 µm, or 200 µm. Furthermore, using the methodology as described herein it is possible to achieve the aforementioned levels of roughness and flatness for a super-hard material having a largest linear dimension of at least 10 mm, 20 mm, 40 mm, 60 mm, 80 mm, 100 mm, 120 mm, or 140 mm.

An example of the aforementioned material is an optical quality polycrystalline CVD diamond window having a thickness of 1 mm and a diameter of 80 mm. After mechanical processing via lapping and polishing, such a window has a transmitted wave front of 2.0 to 2.5 fringes over an aperture of diameter 60 mm using interferometry at 632.8 nm. After application of a selective processing technique as described herein the transmitted wave front is reduced to 0.45 to 0.55 fringes.

The aforementioned characteristics can be achieved in polycrystalline CVD diamond products. Even more extreme characteristics can be achieved for single crystal super-hard materials such as single crystal CVD diamond products. In this regard, another aspect of the present invention provides a single crystal super-hard material comprising:
- a Vickers hardness of no less than 2000 kg/mm$^2$;
- a largest linear dimension of at least 6 mm, 8 mm, 10 mm, 12 mm, 15 mm, or 20 mm;
- a surface having a surface profile with a root mean square deviation from a smooth target surface profile, said root mean square deviation being no more than 30 nm, 20 nm, 10 nm, 5 nm, or 2 nm; and
- optionally a surface roughness $R_a$ of no more than 5 nm, 3 nm, 1 nm, 0.8 nm, 0.5 nm, or 0.2 nm.

The smooth target surface profile may be a flat surface, a convex surface, or a concave surface. Optionally, the processed surface of the super-hard material further comprises a density of crystal defects of no more than $5 \times 10^3$ mm$^{-2}$, $1 \times 10^3$ mm$^{-2}$, or $1 \times 10^2$ mm$^{-2}$ as measured using a revealing plasma etch. Optionally, single crystal super-hard material has a thickness of no more than 1 mm, 800 µm, 600 µm, 400 µm, or 200 µm.

The processing techniques as described herein are particularly useful for large area single crystal super-hard material such as large area single crystal CVD diamond. Large area single crystal CVD diamond wafers may be fabricated by tiling together a number of single crystal diamond substrates and then growing a single wafer of single crystal CVD diamond material over the plurality of single crystal diamond substrates. The resultant large area single crystal CVD diamond wafer tends to have high concentrations of dislocations corresponding to interface regions between the tiled substrates. This can give the large area single crystal CVD diamond wafer non-uniform physical characteristics making uniform surface processing difficult. The multi-stage selective surface processing methodology as described herein, optionally combined with low temperature and pressure surface processing techniques, can aid in providing improved surface finishes for such materials.

In addition to the above, the processing techniques as described herein can be applied to smaller area single crystal and polycrystalline parts to achieve even more extreme levels of precision. Accordingly, another aspect of the present invention provides a super-hard material comprising:
- a Vickers hardness of no less than 2000 kg/mm$^2$;
- a largest linear dimension of at least 1 mm, 2 mm, or 3 mm; and
- a surface profile with a root mean square deviation from a smooth target surface profile, said root mean square deviation being less than 2 nm, 1 nm, or 0.5 nm.

Such small single crystal or polycrystalline parts may have a largest linear dimension less than 10 mm and can be processed to near-atomic flatness.

While this invention has been particularly shown and described with reference to embodiments, it will be understood to those skilled in the art that various changes in form and detail may be made without departing from the scope of the invention as defined by the appendant claims.

The invention claimed is:

1. A method of processing a super-hard material having a Vickers hardness of no less than 2000 kg/mm$^2$, the method comprising:
   (a) forming a surface of the super-hard material to have a first surface profile within a first root mean square deviation from a smooth target surface profile, said first root mean square deviation being no more than 5 µm;
   (b) analysing said surface of the super-hard material to detect a plurality of protruding regions on said surface; and
   (c) selectively processing over a first protruding region on the surface of the super-hard material and, subsequent to selectively processing over the first protruding region, selectively processing over a second protruding region on the surface of the super-hard material to form a second surface profile within a second root mean square deviation from the smooth target surface profile, said second root mean square deviation being no more than 100 nm, wherein the surface of the super-hard material has at least one dimension of at least 10 mm and wherein the selective processing of each protruding region is performed over an area smaller than the area of the surface of the super-hard material;
   wherein step (b) comprises calculating an amount of processing at each of the plurality of protruding regions required to form the second surface profile, and
   wherein step (c) comprises applying said calculated amount of processing at each of the plurality of protruding regions to form the second surface profile.

2. A method according to claim 1, wherein the first root mean square deviation is no more than 3 µm, 1 µm, 500 nm, 100 nm, 50 nm, 20 nm, or 10 nm.

3. A method according to claim 1, wherein the first root mean square deviation is no less than 5 nm, 10 nm, or 15 nm.

4. A method according to claim 1, wherein the second root mean square deviation is no more than 60 nm, 40 nm, 20 nm, 15 nm, 10 nm, or 5 nm.

5. A method according to claim 1, wherein the surface of the super-hard material has at least one linear dimension of at least 20 mm, 40 mm, 60 mm, 80 mm, 100 mm, 120 mm, or 140 mm.

6. A method according to claim 1, wherein the smooth target surface profile is a flat surface, a convex surface, or a concave surface.

7. A method according to claim 1, wherein step (a) is achieved by one or more of: direct growth; cutting; lapping; polishing; chemo-mechanical polishing; ablating; electric discharge machining; and etching.

8. A method according to claim 1, where step (b) is achieved using an interferometer.

9. A method according to claim 1, where step (c) is achieved by one of: a focused beam; a targeted electric discharge; a masked etch; and a mechanical or chemo-mechanical polishing pad which is smaller in area than the surface of the super-hard material being processed such that selective processing over only protruding regions on the surface of the super-hard material is achieved.

10. A method according to claim 9, wherein the focused beam is selected from one of: a laser beam; an electron beam; and a focused ion beam.

11. A method according to claim 1, wherein step (c) further comprises measuring one or more of the protrusions during the selective processing procedure and controlling the selective processing based on said measuring.

12. A method according to claim 1, wherein step (b) and step (c) are performed iteratively.

13. A method according to claim 1, wherein step (c) comprises one of:
  sequential processing in which a protruding region is processed to within a required deviation from the smooth target surface profile before moving to a subsequent protruding region which is processed to within a required deviation from the smooth target surface profile, the process being repeated until all the protruding regions have been processed once at which point the second surface profile is formed; or
  pseudo-pulsed processing in which a protruding region is partially processed towards a required deviation from the smooth target surface profile before moving to a subsequent protruding region which is also partially processed towards a required deviation from the smooth target surface profile, said partial processing continuing with partially processed regions being re-processed at least once to form the second surface profile.

14. A method according to claim 1, wherein after the second surface profile has been formed a further non-selective surface processing is applied to the surface of the super-hard material to reduce surface roughness while retaining a surface within the second root mean square deviation.

\* \* \* \* \*